United States Patent [19]
Yau et al.

[11] Patent Number: 4,917,044
[45] Date of Patent: Apr. 17, 1990

[54] ELECTRICAL CONTACT APPARATUS FOR USE WITH PLASMA OR GLOW DISCHARGE REACTION CHAMBER

[75] Inventors: Leopoldo D. Yau, Portland; Galen H. Kawamoto, Beaverton, both of Oreg.

[73] Assignee: Intel Corporation, Santa Clara, Calif.

[21] Appl. No.: 320,526

[22] Filed: Jun. 2, 1989

Related U.S. Application Data

[62] Division of Ser. No. 262,990, Oct. 26, 1988.

[51] Int. Cl.⁴ .............................................. C23C 16/50
[52] U.S. Cl. .................................... 118/723; 439/805
[58] Field of Search ........................ 118/723; 156/345; 204/298 PS, 298 EP; 403/408.1, 337; 439/564, 573, 661, 801, 805

[56] References Cited
U.S. PATENT DOCUMENTS 4,401,507 8/1983 Engle ................................... 118/723
4,422,407 12/1983 Bessot et al. ......................... 118/723

Primary Examiner—Richard Bueker
Assistant Examiner—Terry J. Owens
Attorney, Agent, or Firm—Blakely, Sokoloff, Taylor & Zafman

[57] ABSTRACT

An electrical contact apparatus for use in a plama or glow discharge chamber, particularly a chamber for depositing silicon oxynitride. A feedthrough member provides an electrical path between the interior and exterior of the chamber. An electrical contact member having an outwardly domed surface engages the feedthrough member. A non-conductive collar is disposed about the domed surface for limiting the flow of gas around the domed surface.

1 Claim, 4 Drawing Sheets

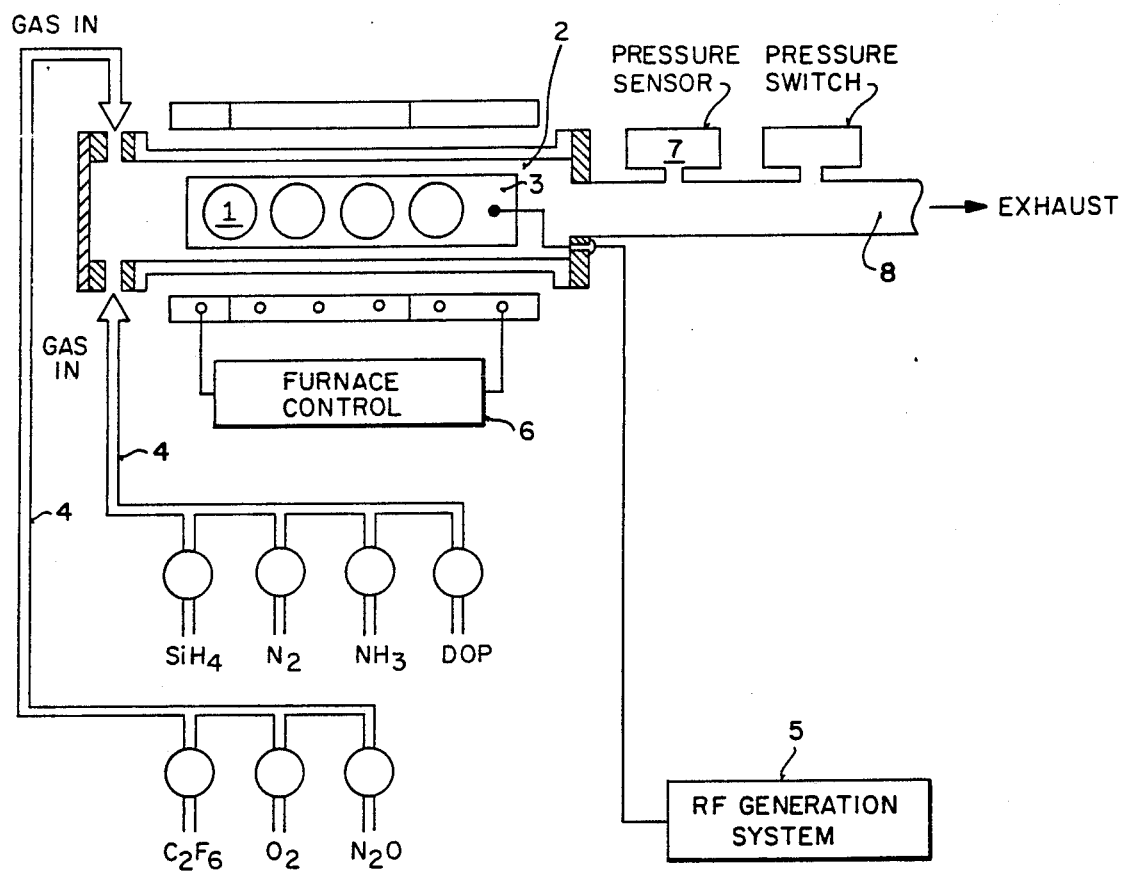
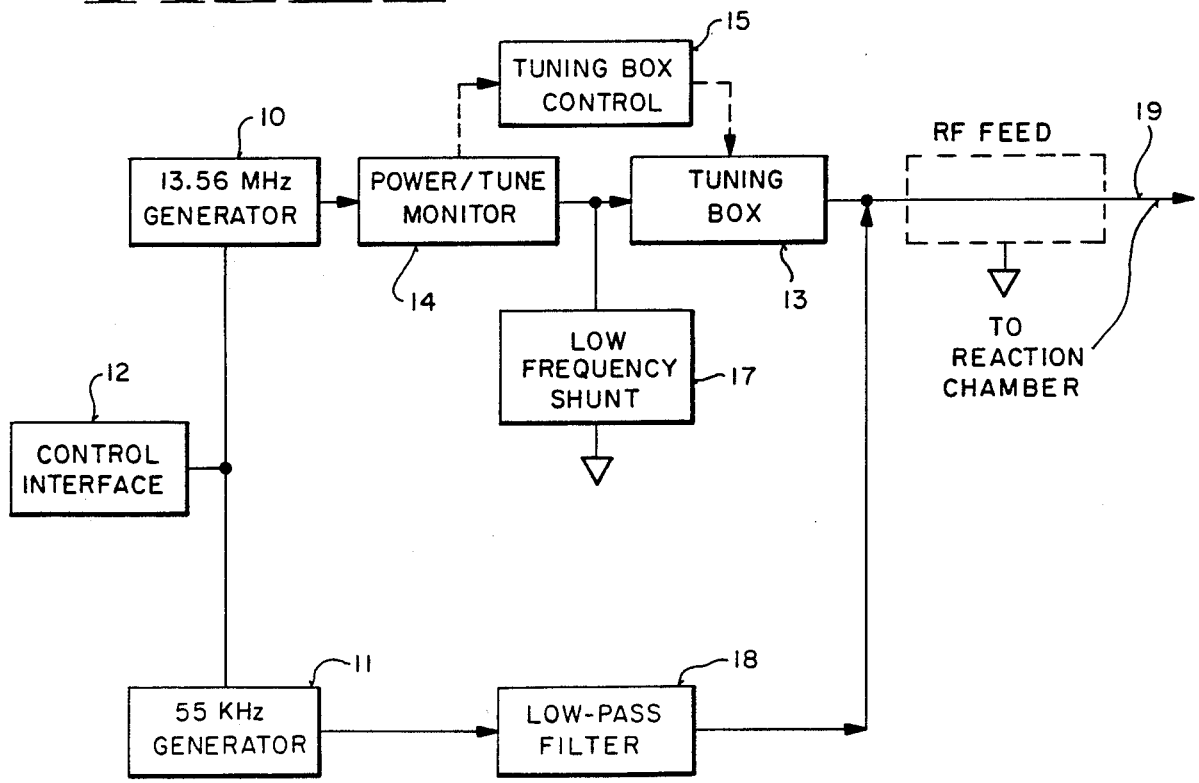

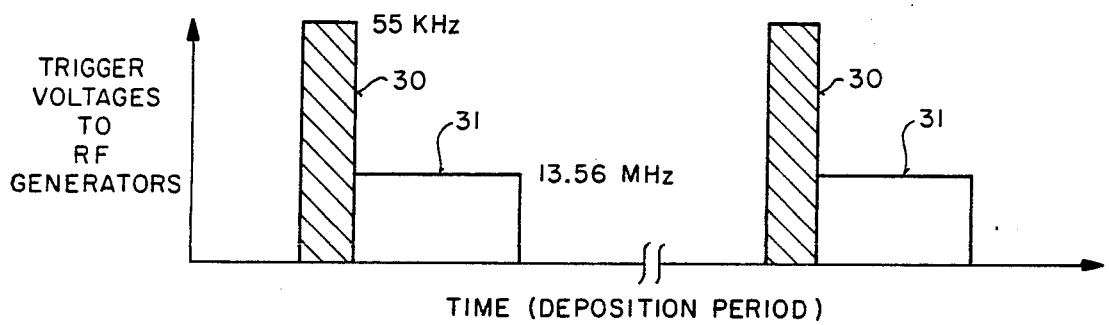
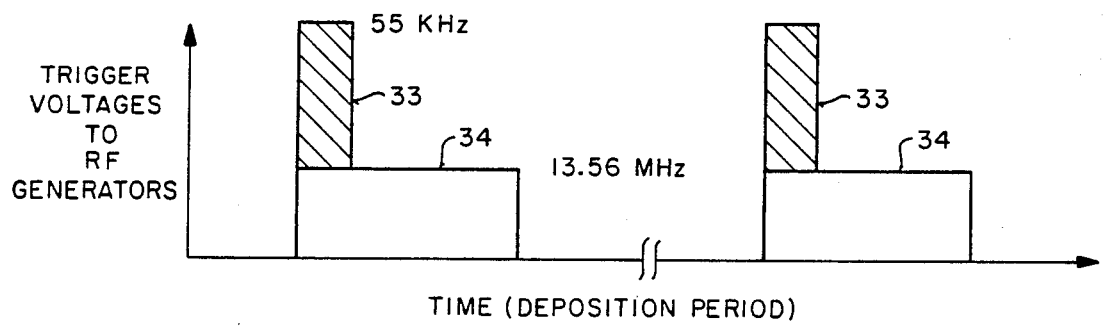
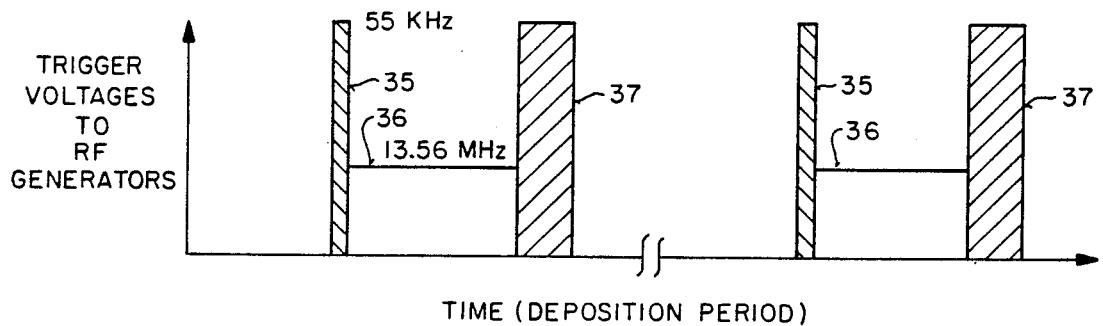

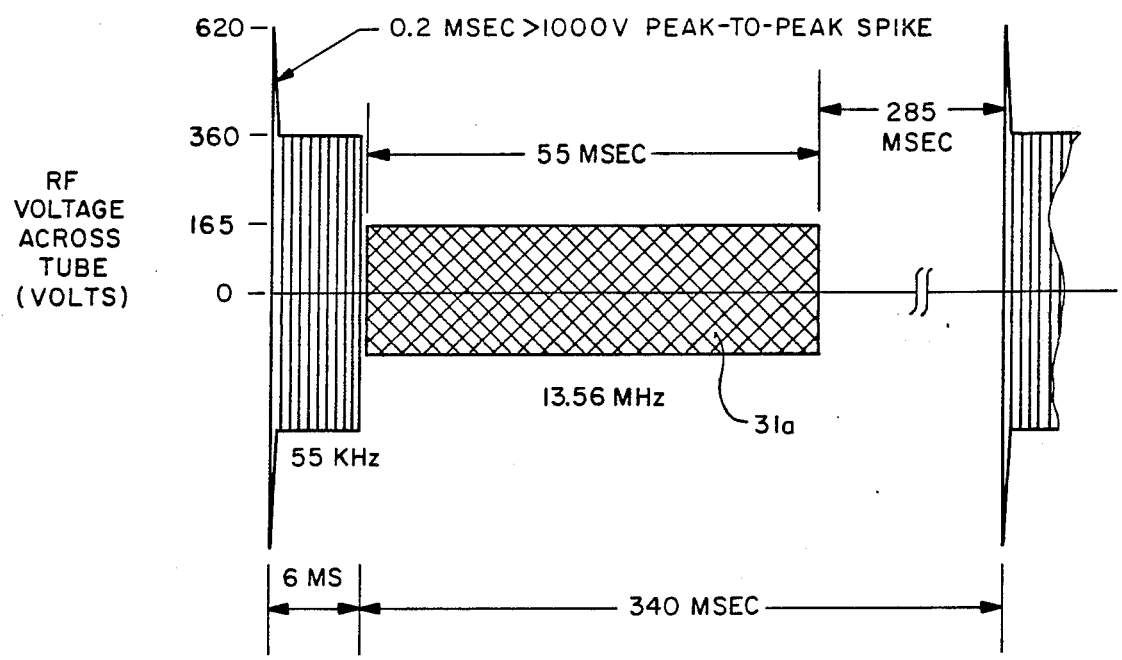
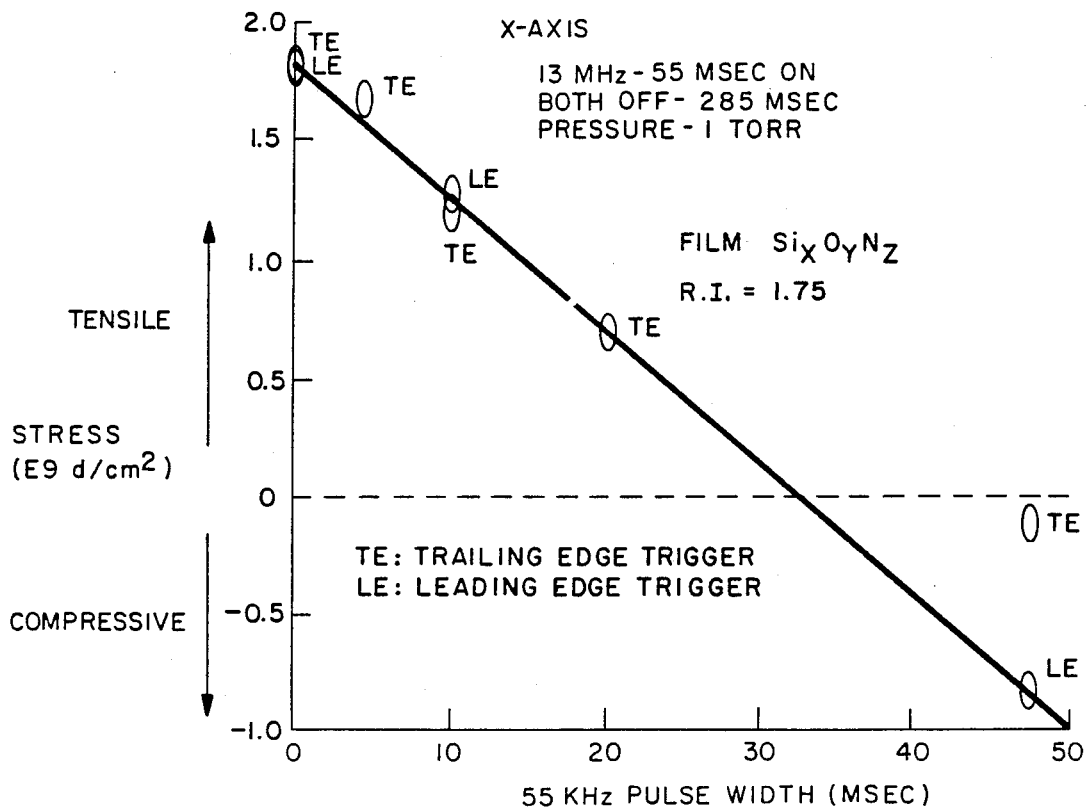

FIG_5
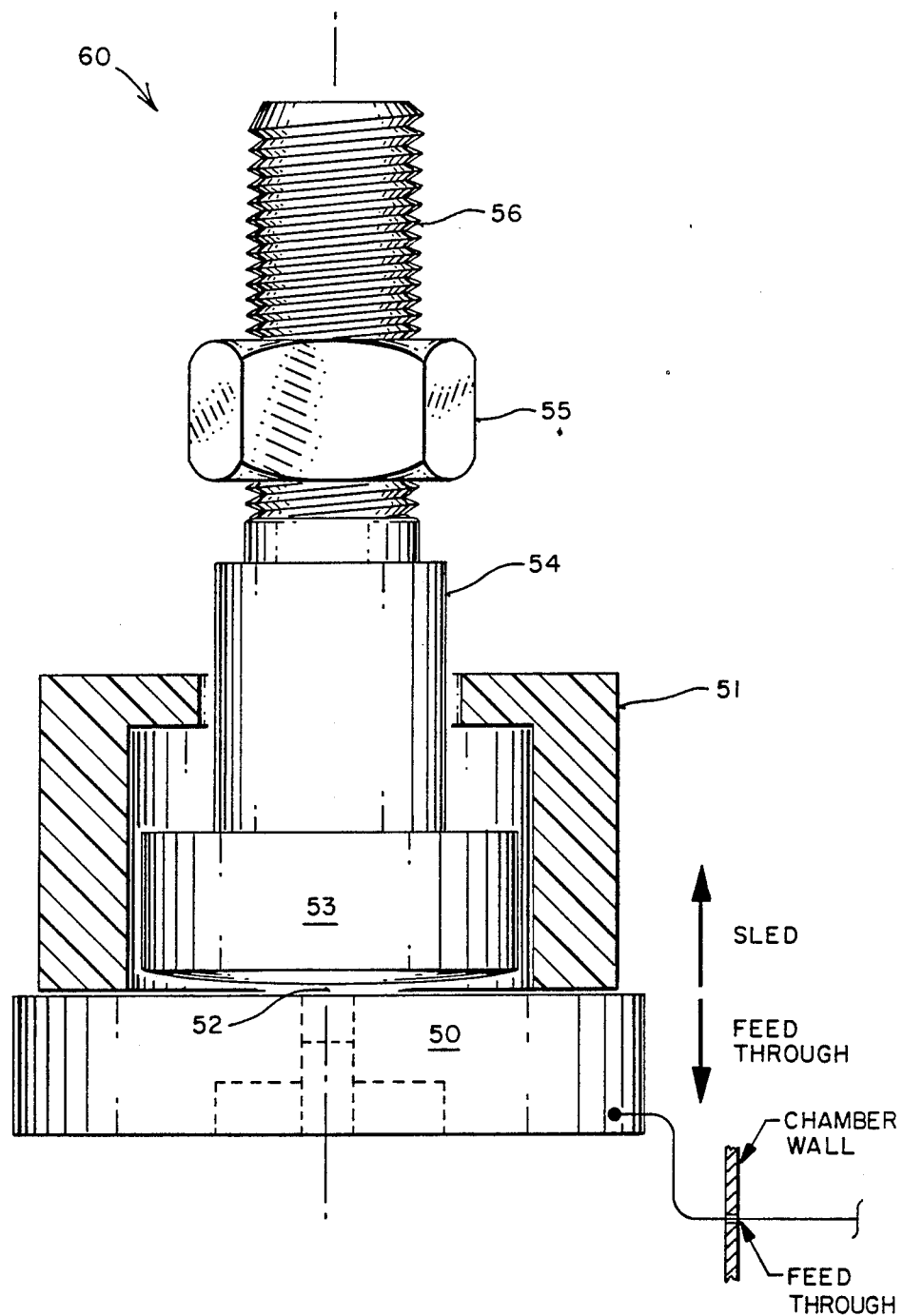

ELECTRICAL CONTACT APPARATUS FOR USE WITH PLASMA OR GLOW DISCHARGE REACTION CHAMBER

BACKGROUND OF THE INVENTION

1. Field of the Invention

This invention relates to the field of chemical vapor deposition (CVD) onto a semiconductor substrate, and more particularly plasma enhanced chemical vapor deposition (PECVD) which utilizes a radio frequency (rf) field to supply energy to gaseous reactants.

2. Prior Art

In manufacturing semiconductor devices, it is often necessary to deposit a thin film on a semiconductor substrate. Such films are used to form conductors, insulators or semiconductor layers. The chemical composition of the film generally determines its function. Of concern in this application is the deposition of an amorphous dielectric, silicon nitride, or silicon oxynitride, onto a semiconductor substrate through use of PECVD.

PECVD utilizes an rf field to supply energy to gases within a reaction chamber or tube. The gases become excited and form glow discharge or plasma; plasma being defined as a partially ionized gas, and glow discharge being a plasma maintained over a specified pressure range (0.5 Torr-2 Torr). The plasma in turn transfers energy into reactant gases, also within the reaction chamber, to enhance the deposition of a thin film onto the substrate or layer formed on the substrate. For example, if silane ($SiH_4$), nitrous oxide ($N_2O$) and ammonia ($NH_3$) are used as reactant gases, a thin film of silicon nitride ($Si_xO_yN_z$) is deposited on the substrate. The major advantage of PECVD is that the substrate need not be heated to high temperatures for deposition to occur and it is therefore useful, for example, to prevent deterioration of materials, unwanted diffusion of dopants, etc. In addition, PECVD produces films with desirable properties such as strong adhesion and the ability to protect the substrate from corrosive agents.

However, PECVD deposited films often incur internal tensile or compressive stress which can cause cracking and peeling of the film or damage to the substrate (or overlying layers formed on the substrate). In the deposition of silicon oxynitride, the internal tension could destroy the film's passivation and protection properties. The mechanism which causes the film stress is not fully understood, but it is speculated to be caused by the incorporation of reaction by-products into the film such as hydrogen, nitrogen, and oxygen. Additionally, the difference in contraction coefficients between the underlying layers and the silicon nitride layer when cooling can cause stress. For higher temperature depositions, the inclusion of by-products into the film is less pronounced, but the advantage of using PECVD at low temperatures (i.e., low temperature processing) is lost.

Consequently, other means to control stress in films deposited through PECVD have been sought. It is known that films deposited at ratio frequencies generally below 1 MHz exhibit compressive stress while those deposited at frequencies above 1 MHz exhibit tensile stress. It has been found that less stress in the film develops if dual frequency radio waves are used to generate the rf field in the reaction chamber. As discussed in Abstract No. 385 of *The Electrochemical Society*, volume 86-2, page 580, one such radio wave is generated at a frequency below 500 KHz and the other at a frequency above 4 MHz. These frequencies are generated simultaneously and continuously over a predetermined deposition period. In this instance, the power of the lower frequency radio wave is controlled and a film with a lower compressive stress than conventionally deposited films is obtained. The frequencies are generated below 500 KHz and above 4 MHz because the interval between these frequencies corresponds to the International Communications window and cannot be used without employing costly shielding.

In a related dual frequency method described in *Industry News*, "Controlling Stress in PECVD Silicon Nitride", page 15, March, 1988, the high and low frequencies are alternated over a deposition period such that silicon nitride films are deposited in alternating layers; one layer exhibiting tensile stress and the layer(s) adjacent exhibiting compressive stress. The composite film, therefore, does not favor compressive or tensile properties which helps to relax the stress in the film as a whole.

The presently invented process also employs the use of dual frequencies to control stress and allows for the deposition of a thin film with lower stress than possible by employing conventional methods. However, instead of generating the dual frequency radio waves in an alternating fashion or continuously over the deposition period, as in the prior art, the invented method strikes the gases in the reaction chamber with a low frequency, high voltage radio wave to enhance plasma formation and then triggers a lower voltage high frequency radio wave. The high frequency wave is capable of causing further gas ionization and hence plasma formation. This method offers several advantages over the prior art dual frequency methods especially for batch PECVD systems such as the ASM® model plasma IIIA systems which can deposit up to 160 four-inch wafers at a time. (ASM® is a registered trademark of Advanced Semiconductor Materials America, Inc.)

SUMMARY OF THE INVENTION

An electrical contact apparatus for use in a plasma or glow discharge chamber, particularly for the deposition of silicon oxynitride is described. In general, the electrical contact apparatus provides contact to a sled inserted into a chamber. A feedthrough member provides an electrical path between the interior and exterior of the chamber. A contact member has an outwardly domed surface for engaging the feedthrough member. A nonconductive collar is disposed about the domed surface for limiting the flow of gases around the domed surface and the surface of the feedthrough member engaging the domed surface.

DESCRIPTION OF THE DRAWINGS

FIG. 1 is a schematic representation of a plasma enhanced chemical vapor deposition reaction system.

FIG. 2 is a block diagram of a radio frequency generation system used in the present invention.

FIG. 3A is a graphic representation of the currently preferred pulsing sequences used in the present invention.

FIG. 3B is a graphic representation of alternate pulsing sequences used in the present invention.

FIG. 3C is a graphic representation of another alternate pulsing sequence used in the present invention.

FIG. 3D is a graphic representation of the voltage appearing across the load/tube using the invented pulsing sequences.

FIG. 4 is a graphic representation of stress in dynes versus low frequency pulse width in milliseconds for a film deposited in accordance with the teachings of the present invention.

FIG. 5 is a cross-sectional elevation view of a contact mechanism used with the present invention.

DETAILED DESCRIPTION OF THE INVENTION

A method of using dual radio frequencies in the deposition of a thin film of silicon oxynitride onto a semiconductor substrate along with a contact mechanism for applying the pulses to a sled or the like is described. In the following description, numerous specific details are set forth such as the frequencies generated, pulse widths, etc. It will be obvious, however, to one skilled in the art that the present invention may be practiced without these specific details. In other instances, well-known structures such as the reaction chamber and rf generation means have not been shown in detail in order not to unnecessarily obscure the present invention.

FIG. 1 illustrates conventional reaction apparatus used in PECVD. The wafer or substrate is placed on a flat surface 1 within the reaction chamber 2. The substrate is positioned either horizontally or vertically depending on the type of chamber used and the type of holder used to hold the wafers or substrates. Reactant gases, for example, silane ($SiH_4$), nitrous oxide ($N_2O$) and ammonia ($NH_3$), are pumped into the chamber 2 via lines 4 as well as other gaseous species used in the formation of plasma. An rf generation system 5 is coupled to an electrode 3 located within the chamber 2. The electrode 3 in turn provides an rf field within the chamber 2. The apparatus of FIG. 1 also illustrates other well-known components such as the furnace control 6, pressure sensor 7, exhaust line 8. A number of different types of chambers can be used, some employing a single electrode and others a number of electrodes positioned parallel to one another within the chamber.

The present invention is directed to an rf generation system which is used for the rf generation system 5 of FIG. 1. Also a contact mechanism for making contact with the electrode is described (FIG. 5).

FIG. 2 illustrates the currently preferred embodiment of a rf generation system. The system comprises a high frequency (>1 MHz) generator 10 and a low frequency (<1 MHz) generator 11. (In general, in this application low frequency refers to a radio frequency signal below 1 MHz such as 55 KHz; high frequency refers to a radio frequency signal above 1 MHz such as 13.56 MHz.) The turning on pulse signals are regulated with respect to one another by a generator control interface means 12. A tuning box 13, monitor 14 and control 15 are used to adjust the impedance matching and maximize the power of the high frequency radio waves. A low frequency shunt or filter 17 shunts any lower than desired frequencies and prevents this low frequency energy from being passed to the high frequency generator 10. The rf signal from the generator 11 passes through a lowpass filter 18 to feedline 19. Both the high and low frequency rf signals are coupled to the electrode or electrodes in the chamber via the feedline 19. While a parallel feeding arrangement is shown, it will be apparent to one skilled in the art that a series feeding arrangement may be used. Here the high voltage generator is coupled to one electrode and the low frequency generator to the other electrode.

A key to the present invention is the timing of the high and low frequency signals applied to the feedline 19. These are controlled by the control interface 12. Any one of numerous, well-known circuits may be used to generate the rf control pulses shown in FIG. 3A, FIG. 3B and FIG. 3C. It is the control signals from interface 12 which turn-on and turn-off the generators 10 and 11 thereby providing the waveforms of FIGS. 3A to 3C. The generation system of FIG. 2 is thus used to regulate the pulses of rf energy applied to the reaction gases over a predetermined film deposition period.

As illustrated graphically in FIG. 3A, in the preferred method, a first radio frequency control pulse 30 of approximately 55 KHz and power of 1000 W is generated and applied to the chamber. The pulse has a duration of approximately 6 msec. in the currently preferred method. That is, the 55 KHz generator is turned on for 6 msec. and the resultant rf envelope has the general pulse shape for pulse 30a as shown in FIG. 3D. (In general, FIG. 3A illustrates the control signals used to control the generation of the rf signals whereas FIG. 3D illustrates the voltage across the load (i.e., tube). This pulse is used to strike the gases within the reactor chamber 2 causing the gases to ionize and thus, forming plasma. Once the gases have begun to ionize, further ionization can be achieved by generating and applying the second, approximately 13 MHz pulse. The 13 MHz pulse 31 can be generated at a lower power of approximately 250 W, lower than the 55 KHz pulse power of 1000 W as the initial activation energy for gas ionization has been previously met by the 1000 W pulse. The second pulse has a duration of approximately 55 msec. in the currently preferred method. Again, it is the envelope of the 13 MHz signal which appears as pulse 31 of FIG. 3A and pulse 31a of FIG. 3D. In the preferred method, the 13 MHz pulse 31 is generated at the trailing edge of the 55 KHz pulse 30. This prevents the two frequencies (if generated simultaneously) from setting up interferences, causing the impedance of the reaction chamber to vary and hence affecting the rf generators. After a period of approximately 346 msec. the pulses 30 and 31 are repeated. The pulses are periodically repeated during the deposition process to allow time to pump out the depleted chemicals and replace them with fresh chemicals before another plasma strike. This method is known to improve large wafer load deposition uniformity.

In the alternate method of FIG. 3B the high frequency pulse 34 is triggered on the leading edge of the low frequency pulse 33. The high and low frequency pulses may be of the same duration as discussed for FIG. 3A. In another method, in FIG. 3C a short low frequency pulse 35 is first used followed by the high frequency pulse 36, and then another low frequency pulse 37.

The above method provides several advantages over the prior art. In a prior art method, alternate dual frequencies are used over the deposition period, resulting in a time span between the application of the high and low rf pulses. As a result, the initial activation energy for ionization of the gaseous species must be overcome by each pulse if maximum plasma formation is to be achieved. In contrast, the present method takes advantage of the high energy, 55 KHz plasma striking pulse, by generating and applying the 13 MHz pulse to the gases during or immediately following the 55 KHz pulse. Also, the method of FIG. 3A provides an advantage over those systems that simultaneously (and continuously) provide both high and low rf signals. The interference between the signals that cause variations in impedance is eliminated.

The high frequency energy more efficiently ionizes the gasses, compared to the low frequency energy once the plasma is struck. In fact, the ionization density is proportional to the frequency. Also, the high frequency deposition exhibits less sensitivity to silicon substrate resistivity, to the patterns formed on the substrate, and to the type of films present on the substrate.

FIG. 4 shows the stress versus the pulse width (for the low frequency 55 KHz pulse) when the waveforms of FIG. 3A and 3B are used in the deposition of silicon nitride. "TE" are the experimental points for the trailing edge triggering (FIG. 3A); "LE" are the experimental points for the leading edge triggering (FIG. 3B). Other conditions for the deposition are shown in FIG. 4.

As shown in FIG. 4, the stress of the silicon oxynitride film of the present invention can be varied from tensile to compressive stress. The desired stress film is achieved by controlling the low frequency pulse width as described and without changing other process parameters. In particular, the preferred method utilizes a low frequency rf striking pulse to overcome the activation energy for gas ionization and without losing the reaction inertia generated by the high energy pulse, employs a low energy high frequency pulse. The plasma, in turn, transfers energy into reactant gases such as silane, nitrous oxide and ammonia. The increased energy enhances a reaction between the gases for the formation of silicon nitride on the substrate. Thus, a thin film of silicon oxynitride is formed over the semiconductor substrate or layer formed on the substrate. Because of the combination of high and low frequencies employed in the present method, the desired film stress can be selected.

In the presently preferred embodiment the reaction apparatus shown generally in FIG. 1 includes a sled which holds a plurality of wafers. The rf electrodes are interdigitated about the exterior of the sled, one electrode being coupled to the rf generation system for the parallel feed arrangement of FIG. 2, and the other electrode being coupled to ground. It is necessary to make contact with these electrodes after the sled has been placed with the chamber 2. FIG. 5 illustrates the mechanism used for providing electrical contact to these electrodes. Contact 50 is an ordinary metal part such as an inconel member. Two contacts, such as contact 50 are used; one is coupled to the generator, and the other to ground both through the wall of the chamber. The parts shown above this member in FIG. 5 are part of the sled; these parts provide an electrical path to the electrodes on the sled.

Electrical contact with the member 50 is made with the contact electrode 60 which again can be an ordinary metal member such as one fabricated from inconel. It is a generally cylindrical member having a contact electrode portion 53, shaft 54 and threaded end 56. A jam nut 55 engages the threaded end 56. Importantly, the contact electrode 53 is outwardly domed and engages member 50 at the central region 52. A concentrically mounted, generally cylindrical insulator collar 51 fits about the shaft 54 and electrode 53 and engages the flat surface of member 50. The insulator may be made of ordinary insulative material such as alumina.

In use, the threaded end 56 provides electrical contact to the sled and contact to the member 50 is made only at region 52 because of the domed electrode 53. The collar 51 prevents circulation of the gases in the chamber in the region of contact, and thus reduces the formation of the silicon oxynitride insulator particularly in the region 52. The shielded contact electrode 53 permits multiple depositions without having to clean the contact after each deposition.

We claim:

1. In a plasma or glow discharge apparatus having a chamber to transfer energy into reactant gases to deposit silicon oxynitride on a plurality of wafers inserted into the chamber on a sled, an improvement to provide electrical contact between an electrode on the sled and a radio frequency generator disposed external to the chamber comprising:

a feedthrough means for providing an electrical path from external of said chamber to internal of said chamber, said feedthrough means terminating in said chamber at a first surface;

an electrode contact member having an outwardly domed surface in engagement with said first surface, said member providing an electrical path from said first surface to said electrode;

a non-conducting collar disposed about said domed surface and engaging said first surface for limiting the flow of gases around said domed surface.

* * * * *

UNITED STATES PATENT AND TRADEMARK OFFICE
CERTIFICATE OF CORRECTION

PATENT NO.    : 4,917,044
DATED         : 4/17/90
INVENTOR(S)   : Yau et al.

It is certified that error appears in the above-identified patent and that said Letters Patent is hereby corrected as shown below:

col. 01, line 60    delete "ratio"      insert --radio--
col. 04, line 25    delete "reactor"    insert --reaction--

Signed and Sealed this

Twenty-fifth Day of May, 1993

Attest:

MICHAEL K. KIRK

Attesting Officer    Acting Commissioner of Patents and Trademarks